(12) United States Patent
Gruber et al.

(10) Patent No.: US 8,138,020 B2
(45) Date of Patent: Mar. 20, 2012

(54) WAFER LEVEL INTEGRATED INTERCONNECT DECAL AND MANUFACTURING METHOD THEREOF

(75) Inventors: Peter A. Gruber, Yorktown Heights, NY (US); Jae-Woong Nah, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 12/731,793

(22) Filed: Mar. 25, 2010

(65) Prior Publication Data

US 2011/0233762 A1 Sep. 29, 2011

(51) Int. Cl.
*H01L 21/00* (2006.01)

(52) U.S. Cl. . 438/108; 438/110; 438/113; 257/E21.499; 257/778; 257/780

(58) Field of Classification Search ........... 257/E21.122, 257/E21.499, E21.503, E21.509, E23.068, 257/737, 778, 779, 780, 786; 438/51, 55, 438/64, 106–110, 113, 118
See application file for complete search history.

(56) References Cited

U.S. PATENT DOCUMENTS

| | | | |
|---|---|---|---|
| 5,128,746 A | 7/1992 | Pennisi et al. | |
| 5,166,097 A * | 11/1992 | Tanielian | 438/667 |
| 5,438,223 A * | 8/1995 | Higashi et al. | 257/774 |
| 5,673,846 A | 10/1997 | Gruber | |
| 6,388,322 B1 * | 5/2002 | Goossen et al. | 257/737 |
| 6,400,172 B1 * | 6/2002 | Akram et al. | 324/756.05 |
| 6,730,542 B2 * | 5/2004 | Wang et al. | 438/108 |
| 6,746,896 B1 | 6/2004 | Shi et al. | |
| 6,902,995 B2 * | 6/2005 | Grigg | 438/612 |
| 7,060,601 B2 * | 6/2006 | Savastiouk et al. | 438/584 |
| 7,109,068 B2 * | 9/2006 | Akram et al. | 438/128 |
| 7,144,299 B2 * | 12/2006 | Arana et al. | 451/28 |
| 7,517,787 B2 * | 4/2009 | Agraharam et al. | 438/613 |
| 7,521,284 B2 * | 4/2009 | Miranda et al. | 438/106 |
| 7,763,985 B2 * | 7/2010 | Kurita et al. | 257/778 |
| 7,791,174 B2 * | 9/2010 | Johnson | 257/621 |
| 7,807,507 B2 * | 10/2010 | Kim et al. | 438/113 |
| 7,863,092 B1 * | 1/2011 | Chaware et al. | 438/106 |
| 7,868,336 B2 * | 1/2011 | Fujimoto et al. | 257/81 |
| 7,906,420 B2 * | 3/2011 | Gruber et al. | 438/597 |
| 7,928,585 B2 * | 4/2011 | Buchwalter et al. | 257/779 |
| 8,003,441 B2 * | 8/2011 | Maeda et al. | 438/113 |

\* cited by examiner

*Primary Examiner* — Chris Chu
(74) *Attorney, Agent, or Firm* — Scully, Scott, Murphy & Presser, P.C.; Daniel P. Morris, Esq.

(57) ABSTRACT

A wafer level integrated interconnect decal manufacturing method and wafer level integrated interconnect decal arrangement. In accordance with the technology concerning the soldering of integrated circuits and substrates, and particularly providing for solder decal methods forming and utilization, in the present instance there are employed underfills which consist of a solid film material and which are applied between a semiconductor chip and the substrate in order to enhance the reliability of a flip chip package. In particular, the underfill material increases the resistance to fatigue of controlled collapse chip connect (C4) bumps.

25 Claims, 15 Drawing Sheets

FIG. 2I (I-1)

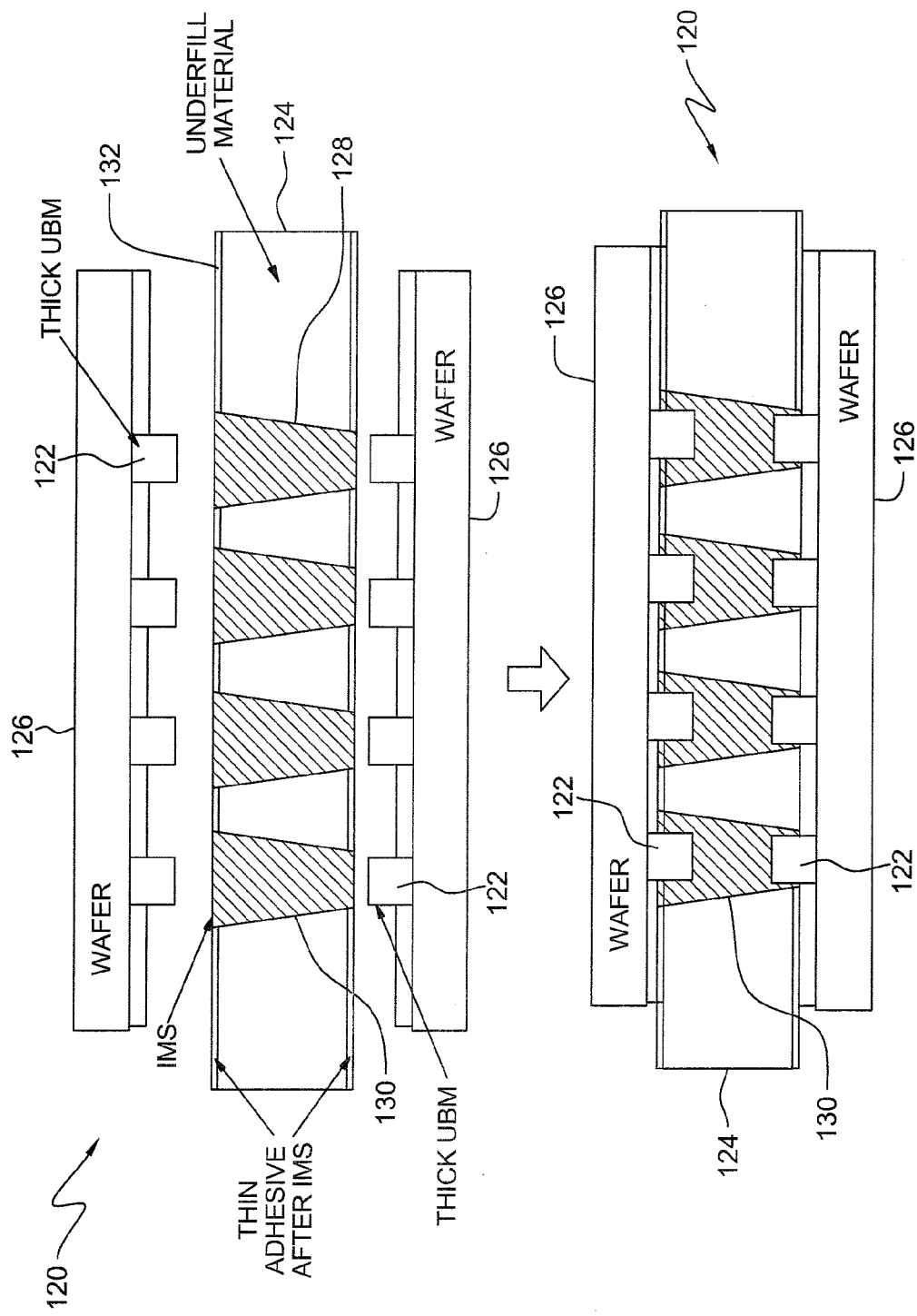

WAFER LEVEL INTEGRATED INTERCONNECT DECAL AND MANUFACTURING METHOD THEREOF

FIELD OF THE INVENTION

The present invention relates to a wafer level integrated interconnect decal manufacturing method. In accordance with the current state of the technology concerning the soldering of integrated circuits and substrates, and particularly providing for solder decal methods forming and utilization, there are employed underfills which comprise liquid encapsulates and which are applied between a semiconductor chip and the substrate in order to enhance the reliability of a flip chip package. In particular, the underfill material increases the resistance to fatigue of controlled collapse chip connect (C4) bumps.

Concerning the foregoing, in accordance with a conventional method, a liquefied underfill is ordinarily dispensed into and is adapted to fill a gap which is present between the semiconductor chip and the substrate through the intermediary of capillary force, subsequent to implementing the assembly of the chip to the substrate. In that connection, the capillary action is normally slow in nature in filling the interspace that is present between the semiconductor chip and the substrate, and thereafter the curing of the liquid underfill requires a lengthy time in a high-temperature or oven-like environment. Consequently, the currently employed types of underfill processes represent a bottleneck in the expenditure of manufacturing time. Moreover, due to the developing miniaturization aspects of the various electronic devices in the technology and industry, which renders the gap which is present between the semiconductor chip and substrate to become evermore narrow, the underfill method causes the entraining of voids in the electronic packages intermediate the semiconductor chips and the substrates, potentially adversely effecting the reliability thereof.

THE PRIOR ART

Heretofore, as set forth in the disclosure of Pennisi, et al., U.S. Pat. No. 5,128,746, there has been utilized a no-flow underfill which is intended to avoid the limitation encountered in the capillary flow of underfill, and which combines the aspects of solder joint reflow and underfill into a single process step. The no-flow segment in the filling process is concerned with dispensing the underfill material on the substrates prior to the placement of a single chip.

Pursuant to Shi, et al., U.S. Pat. No. 6,746,896 B1, there is disclosed a wafer level underfill method which is also intended to avoid the capillary flow of underfill, and which combines the solder joints reflow and underfill curing processes into a single step. However, the wafer level underfill is applied on a bumped wafer and the wafer is then diced into single chips, and thereafter each semiconductor chip with the underfill present thereon is aligned with and positioned on a substrate. In both of the foregoing instances of respectively the no-flow underfill and wafer level underfill processes there is, however, necessitated a separate solder bumping step on the semiconductor chip prior to the application of the underfill, and a thermal compression force is required in order to exclude the presence of any underfill material from the solder joints.

Pursuant to a further aspect which is described in Gruber, U.S. Pat. No. 5,673,846, the latter of which is commonly assigned to the Assignee of the present application, there is provided a unique and novel solder decal which is rendered possible through the application of an injection molding solder (IMS) process. In that instance, a decal is primarily employed as a mold and which is fixed in forming solder bumps on a wafer or on substrates. However, pursuant to the present invention, the decal can also be employed as the actual underfill material, wherein in one form, three superimposed layers of decals can produce solder features which are on both sides of one decal, i.e. a center decal, subsequent to peeling off the two other layers.

SUMMARY OF THE INVENTION

Accordingly, in order to improve upon the foregoing methods, an object of the present invention resides in simplifying the conventional steps of solder bumping on wafer and underfill processes and the further art relating to the solder anchoring decal and method of manufacture as described in U.S. Pat. No. 5,673,846 whereby, instead of effectuating underfill dispensing after solder bumping on the wafer according to a conventional process, pursuant to the present invention the solder bumping and underfill process method can be implemented independently of the wafer process, while avoiding the trapping of voids. Thus, while wafers are processed through Under Bump Metallurgy (UBM) deposition, and patterning processes implemented to facilitate wetting of solder, in a film-type underfill, which film in decal form has throughholes, the latter are filled with solder. Subsequent to the inspection of the underfill with the solder, it is attached to a wafer whereby this manner of processing reduces total cycle time and enables each process flow step to be optimized independently, thereby further reducing the overall or total time of the bumping process. Thereafter, the wafer is diced into single chips, and individual chips are placed on the substrates. This method is also applicable to a three dimensional stacking of wafers or individual dies.

BRIEF DESCRIPTION OF THE DRAWINGS

Exemplary aspects of the present invention may now be ascertained from the accompanying drawings, wherein:

FIG. 2I (I-1) illustrates steps in flip chip assembly after dispensing of adhesive on a substrate;

FIGS. 4A and 4B illustrates alternative wafer to wafer bonding steps;

DETAILED DESCRIPTION

Figure 1C:
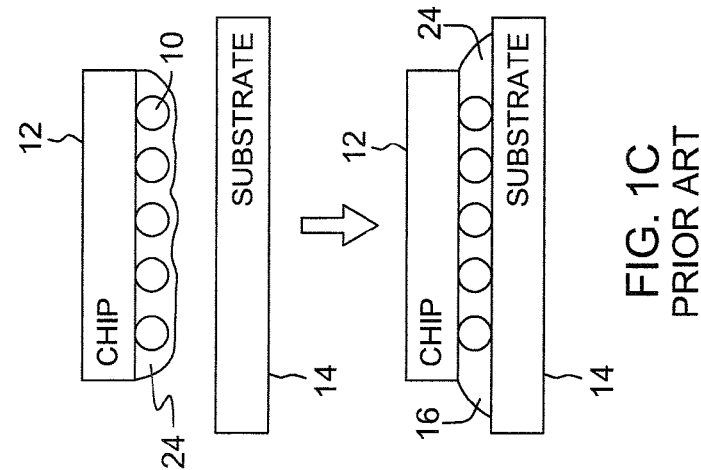
FIG. 1C illustrates a wafer level underfill method pursuant to the prior art.
Figure 1B:
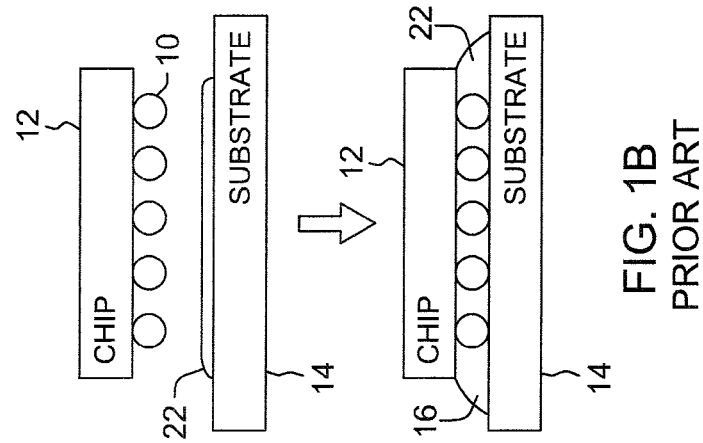
FIG. 1B illustrates a no-flow underfill method pursuant to the prior art.
Figure 1A:
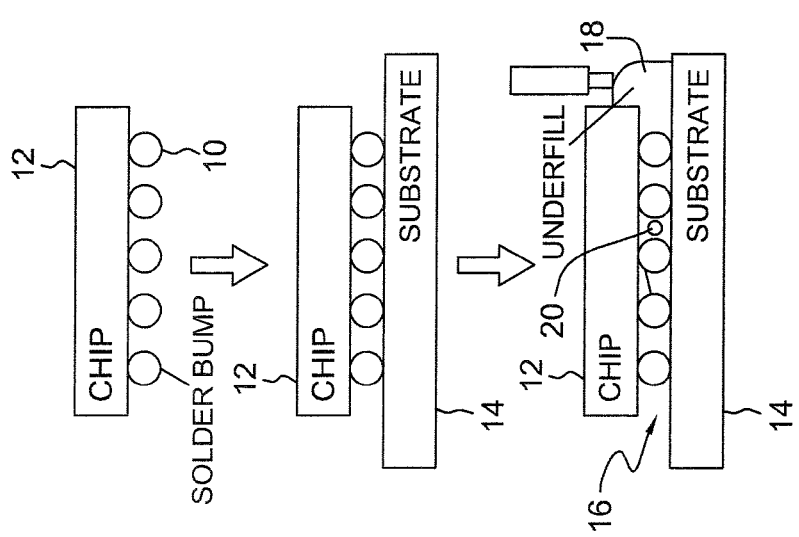
FIG. 1A illustrates a capillary underfill method pursuant to the prior art.

Referring in particular to the drawings, applicants note that FIGS. 1A-C pertain to various prior art methods of utilizing underfill materials between semiconductor chips and substrates.

Thus, FIG. 1A discloses in sequence steps of a capillary underfill method whereby solder bumps 10 are attached to a semiconductor chip 12, then the latter is positioned on a substrate 14 so as to cause outer located bumps 10 to form a gap 16 between the semiconductor chip 12 and the substrate 14. Thereafter underfill material 18 in liquid form is filled into the gap 16 between the semiconductor chip and the substrate adapted to encompass the solder bumps. However, this method may lead to the entrapment of voids 20 between the bumps 10, in view of the ever decreasing size of the gaps 16 due to the miniaturization of the electronic packages and various components in the current technology.

As indicated in FIG. 1B of the drawings, in an exploded view there is illustrated a no-flow underfill method pursuant to the prior art wherein a semiconductor chip 12 having solder bumps 10 attached thereto is placed in spaced relationship with a substrate 14, the surface of which is covered with a no-flow underfill material 22. Thereafter the chip 12 with the solder bumps 10 are pressed into the no-flow underfill material. This, however, provides for the possibility that the underfill material 22 may coat the surface of at least some of the solder bumps to, resultingly preventing electrical contact with the substrate, and thereby adversely affecting the reliability of any electronic package formed by this process.

Furthermore, with regard to FIG. 1C of the drawings, which also illustrates in a exploded manner, a prior art wafer level underfill method, in that instance, the semiconductor chip 12 with the solder bumps 10 attached thereto, leave the latter already encased in a wafer level underfill material 24 which with the chip and bumps is then pressed down onto the substrate 14, and which may also, similar to the no-flow underfill, raise the possibility that the solder bumps 10 may be surface covered prematurely with underfill material 24, which may inhibit any proper or reliable electrical contact with operative components on the substrate 14.

Figure 2A:
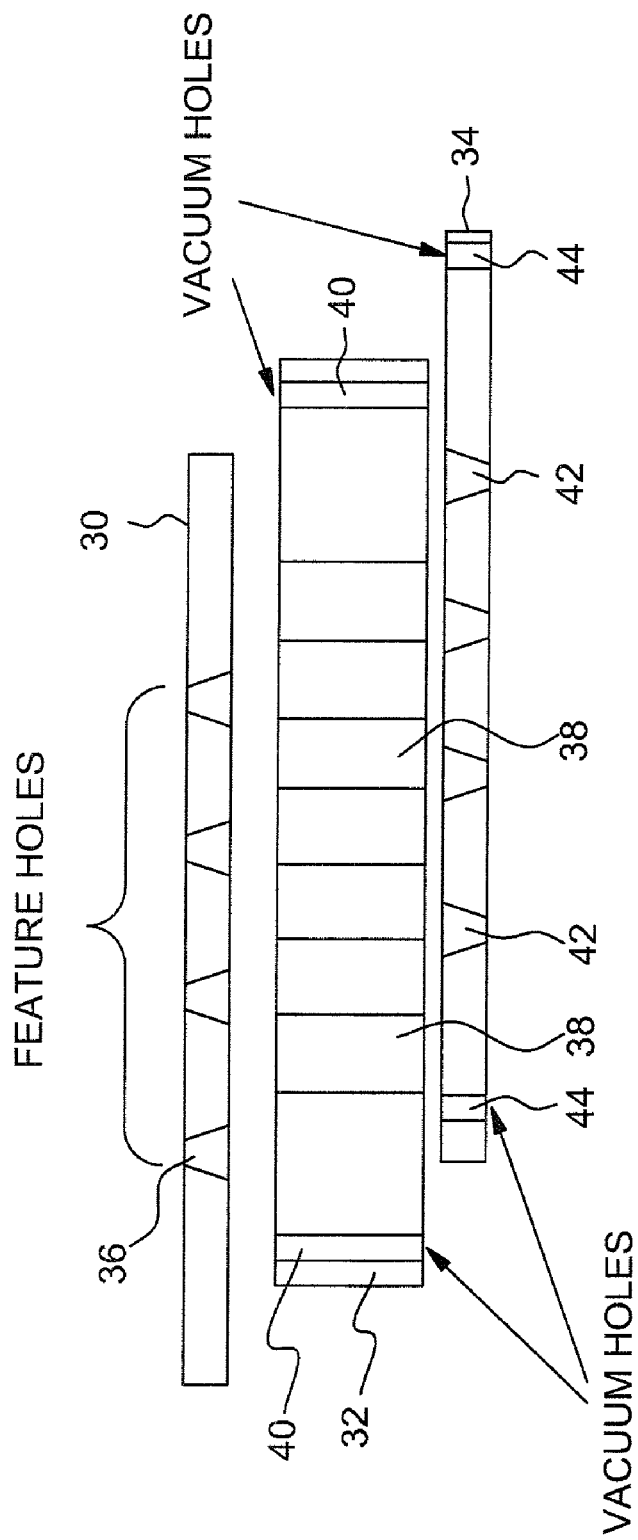
FIG. 2A illustrates an exploded view, in section, of three decals with through-holes.

Reverting to the invention in FIG. 2A of the drawings, there are indicated three decal layers 30, 32, 34 which may be in the form of film webs, and wherein the upper layer 30 includes tapered or conical feature holes 36, the center layer 32 also includes through holes 38 which are adapted to the aligned with the feature holes 36 and which layer 32 contains vacuum holes 40 around the periphery thereof, and further the third layer 34 also has tapered through holes 42 including vacuum holes 44 which are adapted to the aligned with those in the center layer 32.

Figure 2B:
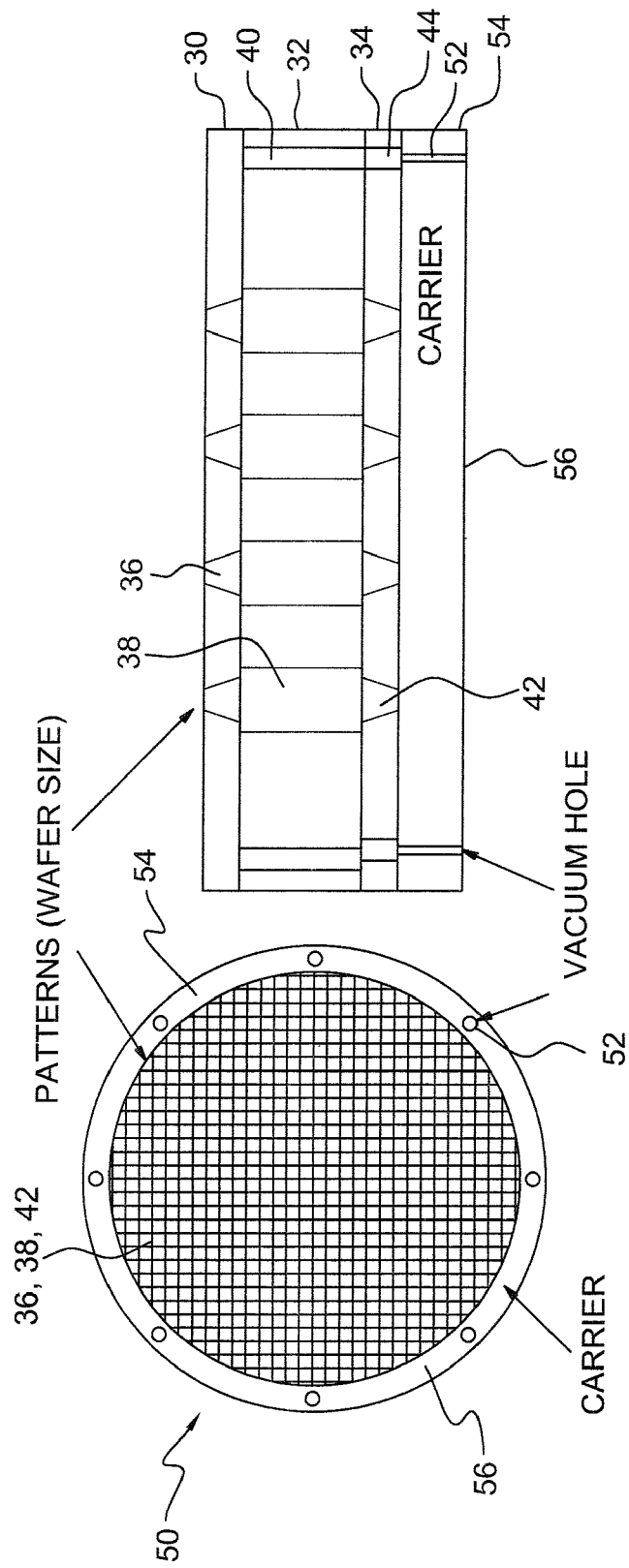
FIG. 2B illustrates, respectively, the decals of FIG. 2A shown in aligned superposition, and in smaller scale view wafer-sized.

In essence, as shown in FIG. 2B of the drawings, in both plan/view wherein the essentially circular wafer structure 50 comprises a pattern in a wafer size array for the different holes 36, 38, 42 which are aligned with respect to the superimposed upper, lower and center films, and wherein vacuum holes 52 arranged spaced about the rim 54 of a carrier 56 positioned beneath the lower film 34 are aligned with the vacuum holes 44, 40 extending through the lower film 34, and center film 32 contacting the facing surface 58 of the upper film 30 so as to clamp together all three film layers in an aligned position.

The carrier 56 may be constituted from material of a similar CTE (Coefficient of Thermal Expansion) and size as the wafer 50, with the exception that it includes an outer attachment edge or rim portion. Hereby, all of the decals 30, 32, 34 may be constituted typically from a polyimide, such as Kapton, Upilex, Ultem (registered trademarks) which are able to withstand a subsequent IMS (Inspection Molding Solder) process which is conducted at the solder melting temperature. In particular, the center decal layer 32 which is utilized as the final underfill material may be made from a filler-containing polymer which will improve the required properties of CTE, modulus, etc.

Moreover, the collective through holes found in each of the upper, center and lower decals 30, 32, 34 can be produced either etched by photolithographical processes, laser drilling, or the like.

Figure 2C:
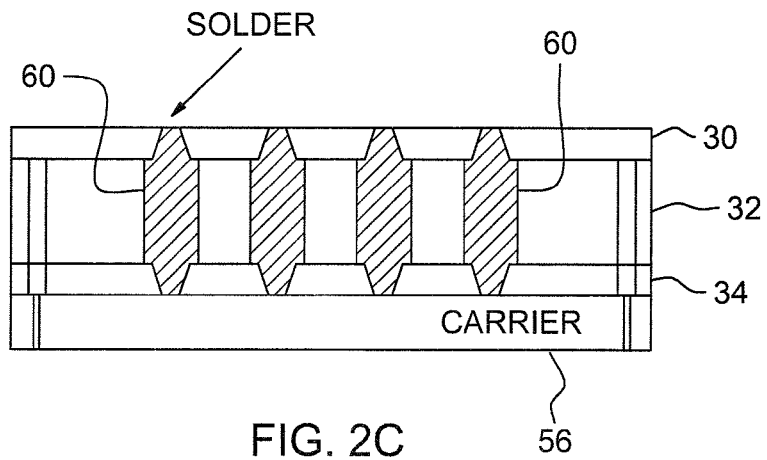
FIG. 2C illustrates the decals filled with solder.
Figure 2D:
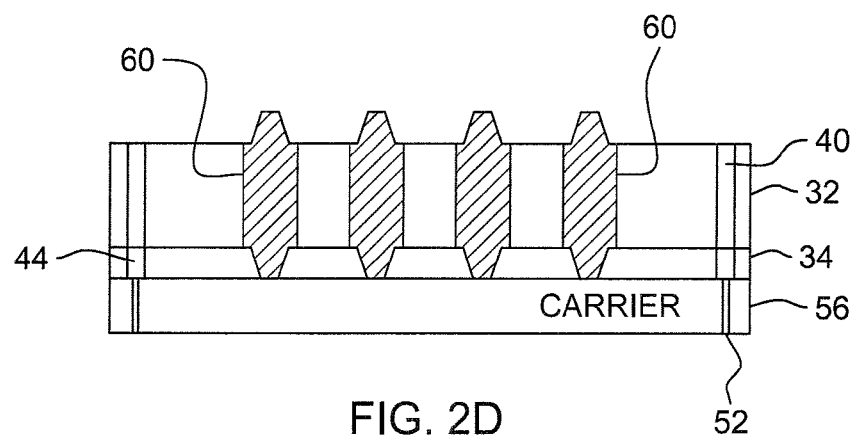
FIG. 2D illustrates the top layer film removed.
Figure 2E:
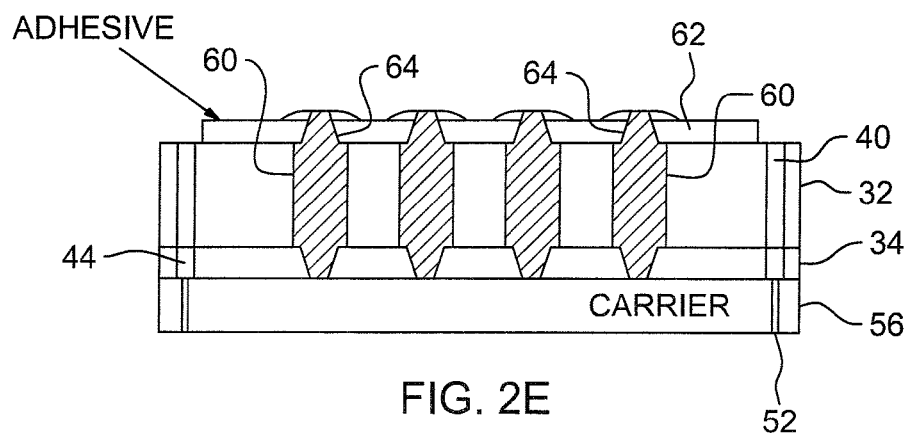
FIG. 2E illustrates adhesive applied thereto.

In particular, it is an important aspect to note that the upper and lower decals 30, 34 which are on both sides of, respectively, the center decal 32 have the tapered holes 36, 42 which enlarge in size towards the surfaces facing the through holes 38 which are aligned therewith in the center decal 32. Thus, upon filling these aligned feature holes with solder 60, as shown in FIG. 2C, it is then possible to remove in sequence, as in FIG. 2D the top decal or film layer 30 by peeling the latter away from the center decal 32 constituting the underfill material, and upon release of the vacuum from the aligned vacuum holes; thereafter as shown in FIG. 2E, a suitable adhesive 62 is dispensed onto the upper surface of the center decal 32 encompassing the projecting solder portion 64 which remains in place subsequent to the removal of the top layer film or decal 30.

Alternatively, an adhesive may also be applied between the lower decal 34 and a carrier, which can be made from materials easily adhered to each other and separated by means of heat.

Figure 2F:
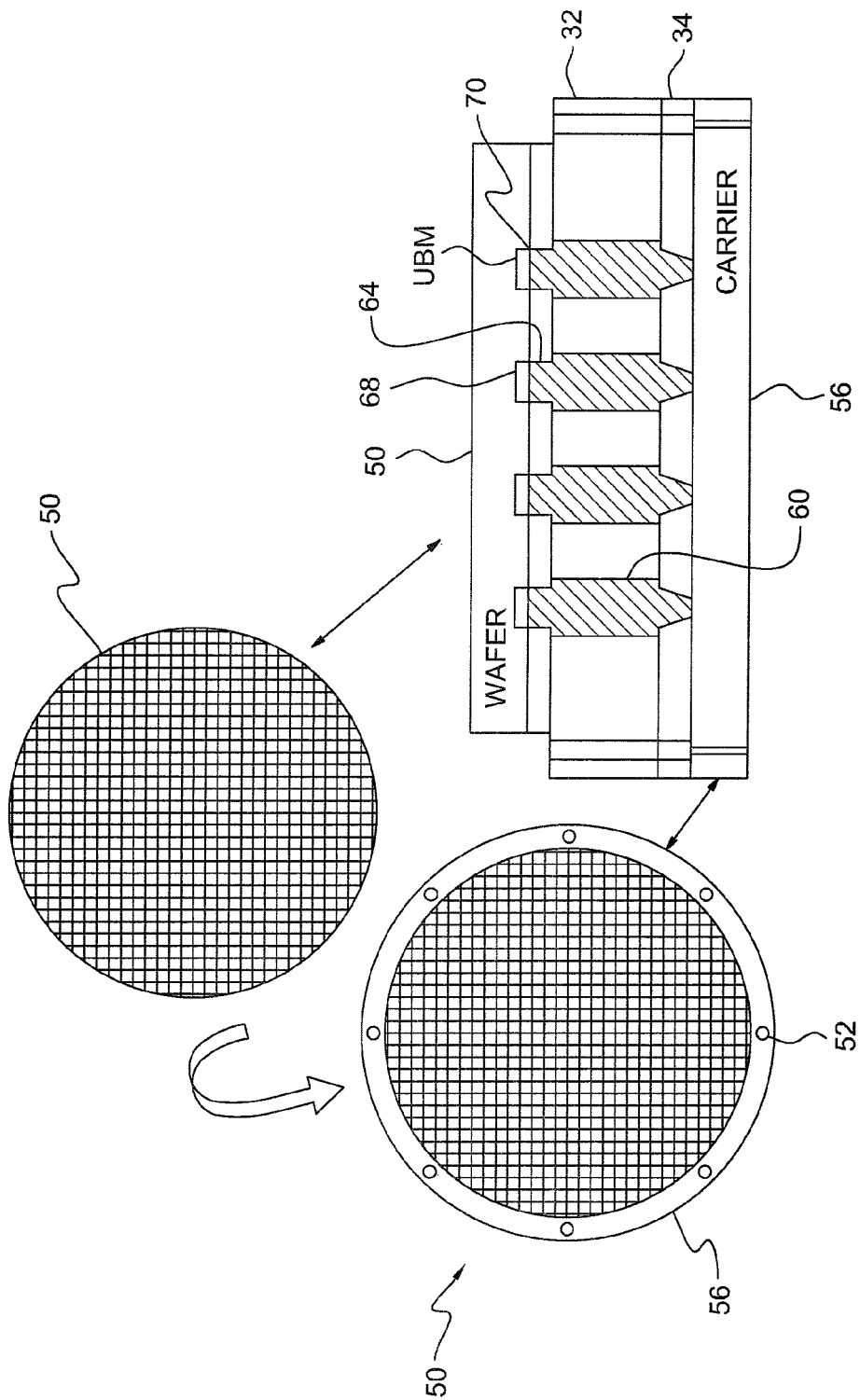
FIG. 2F illustrates wafer bonding to the decal.

As illustrated in FIG. 2F, a wafer 50 having pads 68 which include Under Bump Materials (UBM) 70 is positioned onto the adhesive 62 and solder portions 64, and engaged with the adhesive on the upper surface of the exposed surface of the center decal 32.

Figure 2G:
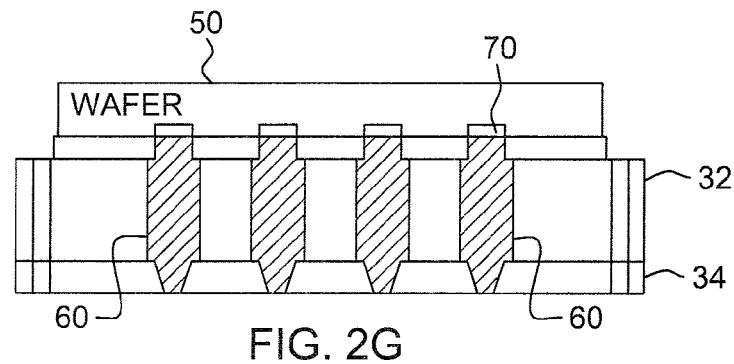
FIG. 2G illustrates carries removal.
Figure 2H:
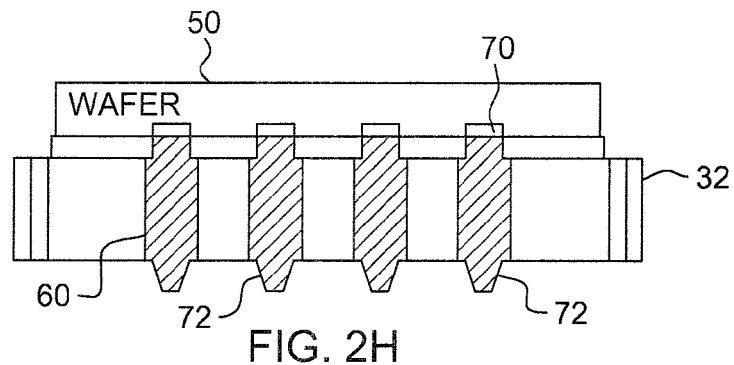
FIG. 2H illustrates removal of bottom layer decal.

Thereafter, as shown in FIG. 2G of the drawings, the carrier 56 is removed from the lower surface of the lower or bottom decal 34, thereby enabling the lower decal or bottom layer to be pulled away from the surface of the center decal 32 with which it is in contact, as shown in FIG. 2H of the drawings, thereby exposing the opposite end portion 72 of the solder 60 projecting from the center decal 32, the latter of which constitutes the underfill material.

Figure 2I:
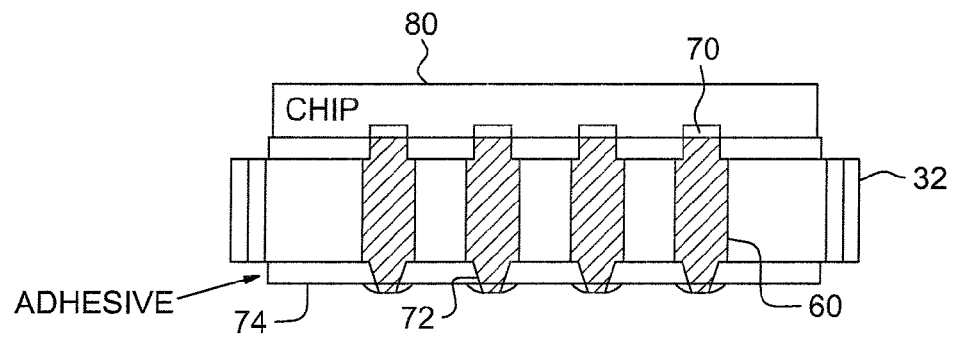
FIG. 2I illustrates dispensing of an adhesive on one side of the chip after dicing the wafer.
Figure 2J:
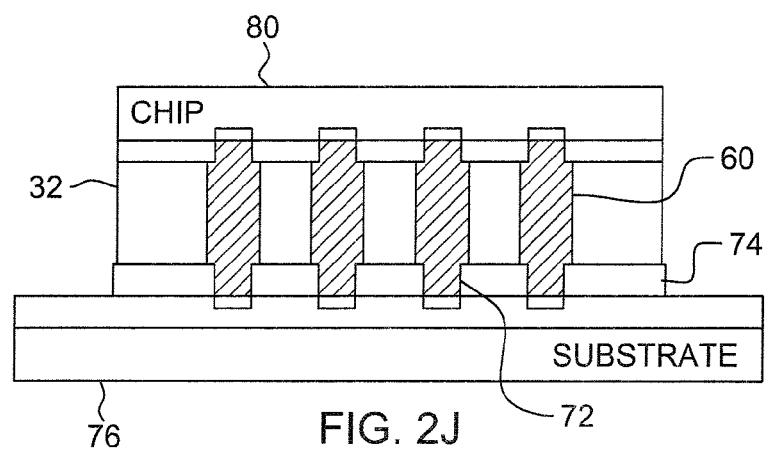
FIG. 2J illustrates flip chip assembly.

As shown in FIG. 2I, after dicing the wafer (not shown), an adhesive 74 is then applied to the bottom surface of the center decal 32, encompassing the projecting solder material 72; and a substrate 76 is applied to the bottom surface of the decal 32, as shown in FIG. 2J, contacting and compressing the adhesive 74 about the solder material portion 72.

As shown in the alternative embodiment of FIG. 2I(I-1), the wafer 50 is diced to form the chip 80 and the adhesive on the substrate assembly is dispersed, whereby the substrate 76 is then applied onto the adhesive 74 encompassing the lower surface of the center decal 32.

Figure 2K:
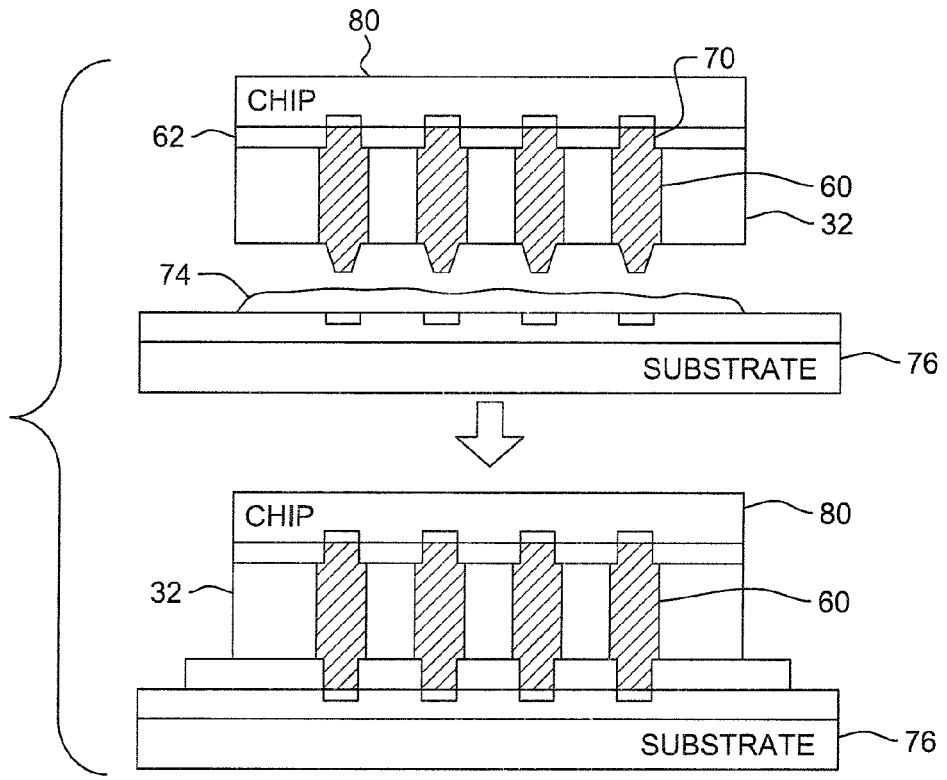
FIG. 2K illustrates wafer-to-wafer bonding.
Figure 2K:
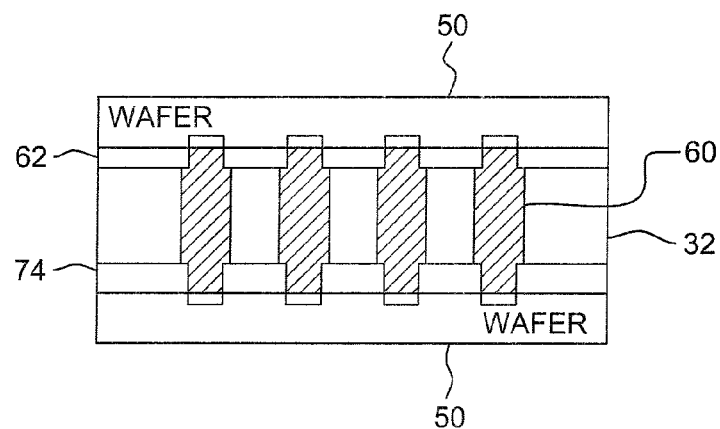

In order to implement three dimensional 3D stacking, as shown in FIG. 2K by wafer to wafer bonding, or alternatively die to die bonding, after dicing of the wafer this step may be implemented for subsequent three-dimensional (3D) stacking.

Figure 3A:
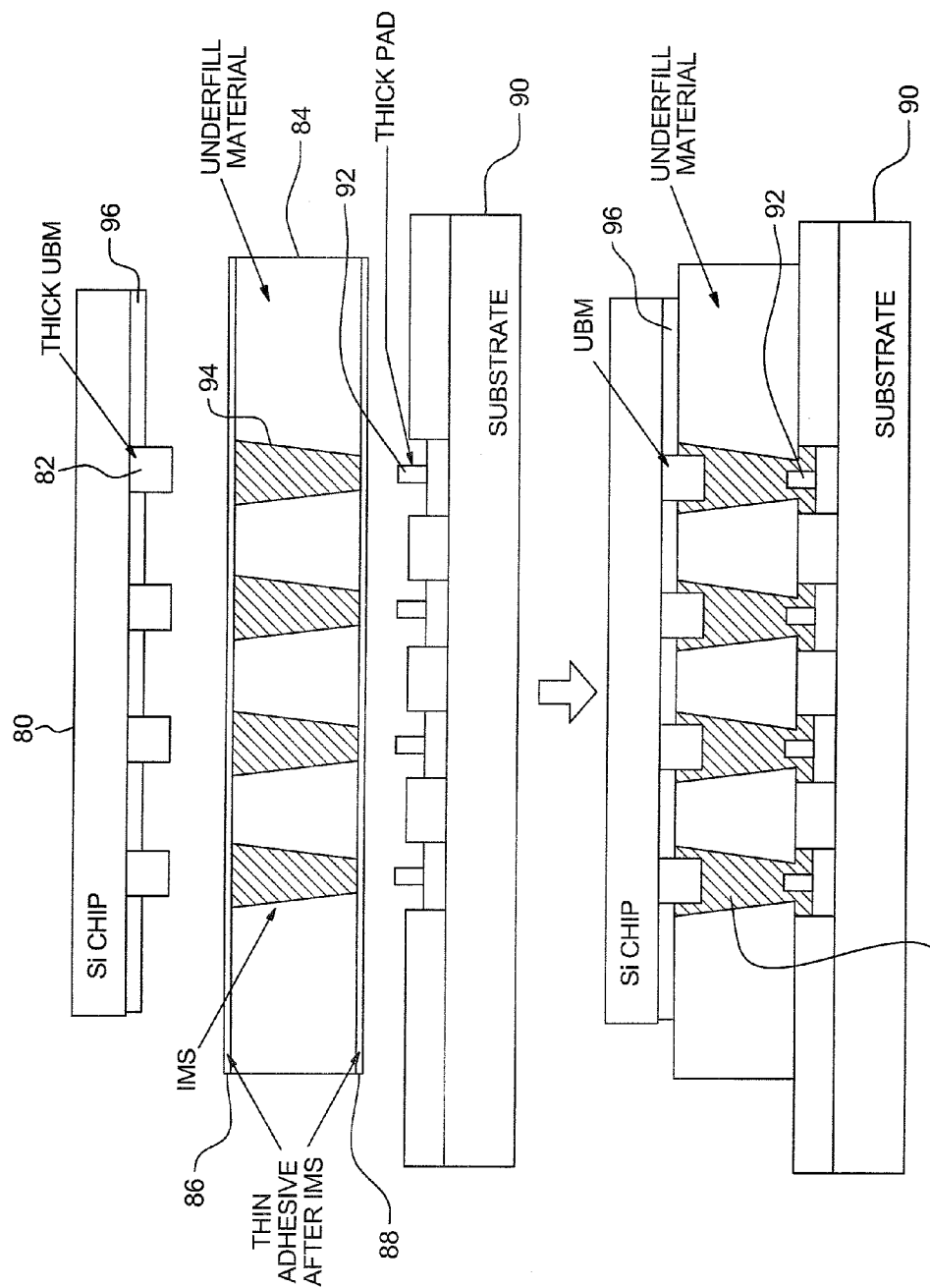
FIG. 3A illustrates steps in assembly UBMs, pads and film layer.

As shown in FIG. 3A, illustrated a silicon chip 80 with thick UBMs 82 and passivation layer 96 projecting therefrom, the underfill material comprising the essentially center decal 84 will be covered with a thin adhesive 86, 88 on both sides thereof subsequent to implementing an IMS process, as previously described, and thereafter is effected a removal of the upper and lower decals.

Hereby, the lower surface of the underfill material providing decal 84 may be contacted by a substrate 90 having thick electrical pads 92 positioned thereon, and the entire assembly pressed together whereby the silicon chip 80 with the UBMs 82 thereon engages into the upper end of the solder material 94 with the adhesive 86, 88 compressed therebetween, whereas at the lower surface, the substrate 90 with thick pads 92 is pressed into the lower end portions of the solder 94 and into contact with the lower surface of the underfill material 84.

Figure 3B:
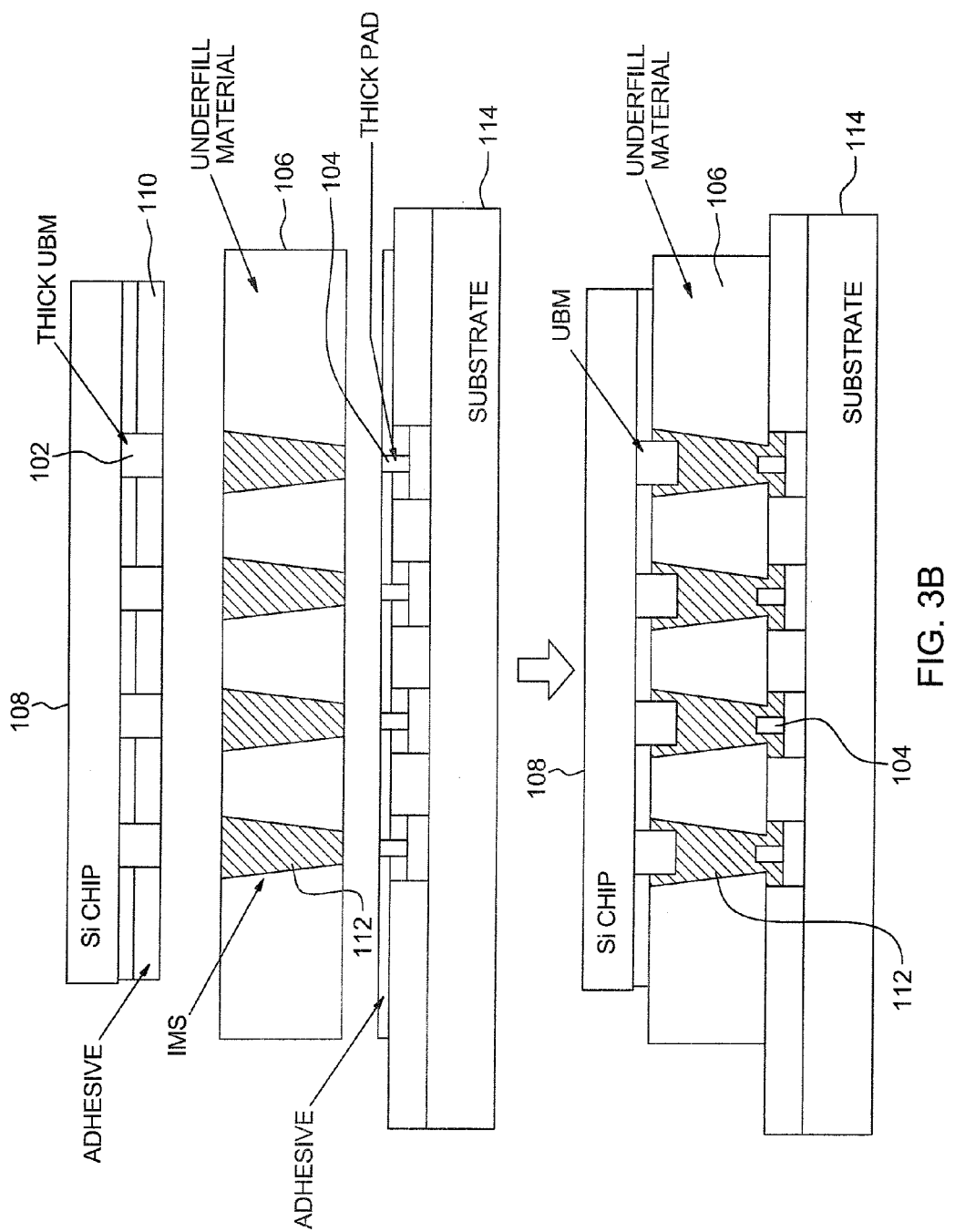
FIG. 3B illustrates alternative steps relative to FIG. 3A.

As shown in FIG. 3B, with the thick UBMs 102 and a thick pad 104 and with a single layer of film 106, a silicon chip 108 having a thin adhesive layer 110 applied about the thick UBMs 102 facing towards the underfill material decal 106, the latter of which is filled with solder 112 derived from the IMS process, a lower substrate 114 is positioned at the opposite side of the underfill material decal 106, including the thick pad 104, whereby the entire assembly is then pressed together, similar to the process as in FIG. 3A.

As shown in FIG. 4A there is provided a wafer-to-wafer bonding structure 120 with thick UBMs 122 and a single layer of film 124 whereby a wafer 126 (rather than a silicon chip) is provided with thick UBMs 122 facing towards the single layer underfill material decal 124 having through openings 128 filled with solder 130 in an IMS process, and thin layers of adhesive 132 applied to both surfaces thereof subsequent to the IMS process having been implemented.

At the opposite side or lower side of the underfill material layer 124, there is provided a similar wafer 126 with thick UBMs 122 facing towards the holes 128 filled with solder 130 facing at the bottom of the underfill material decal, and the components are then pressed together, whereby the upper wafer 126 presses into the solder 130 at the upper end with adhesive 132 interposed therebetween, and the lower wafer 126 presses into the lower end with the UBM's 122 in contact with the solder material 130 and also with an adhesive material layer 132 pressed therebetween.

Figure 4B:
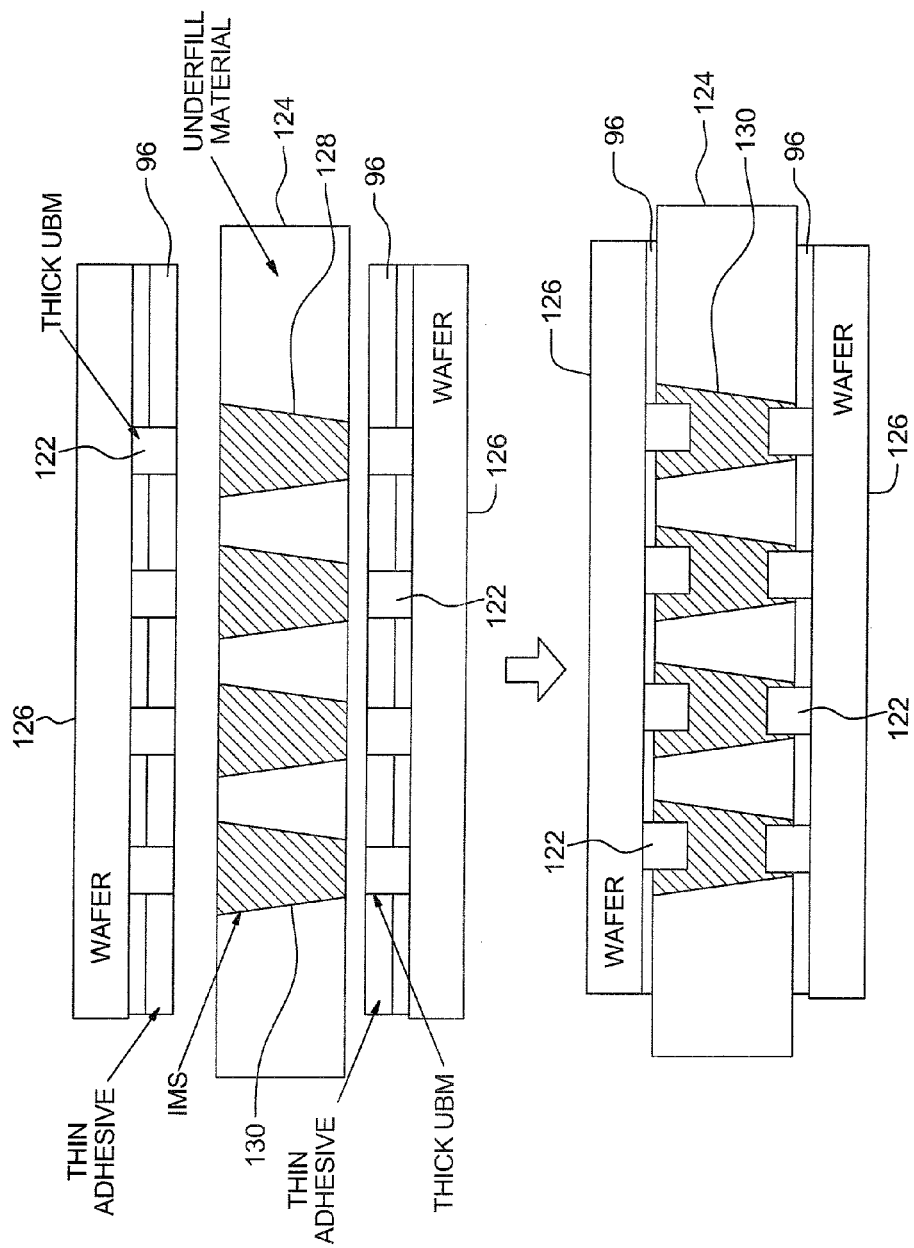

As shown in FIG. 4B, there is provided a wafer to wafer bonding structure with thick UBMs 122 and decal of a single layer of film 124, wherein the upper wafer with thick UBMs has a thin adhesive layer 132 applied thereabout, and a thin adhesive layer 132 is also applied to encompass the thick UBMs 122 projecting towards the underfill material decal 124 in a lower wafer at the opposite side of the underfill material whereby these are then compressed together such that the adhesive material is interposed between both wafers and the opposite surfaces of the underfill material decal and the UBMs of both the upper wafer and lower wafer contact into the solder 130 in each of the respective through holes 128 in the underfill material decal 124.

Figure 5A:
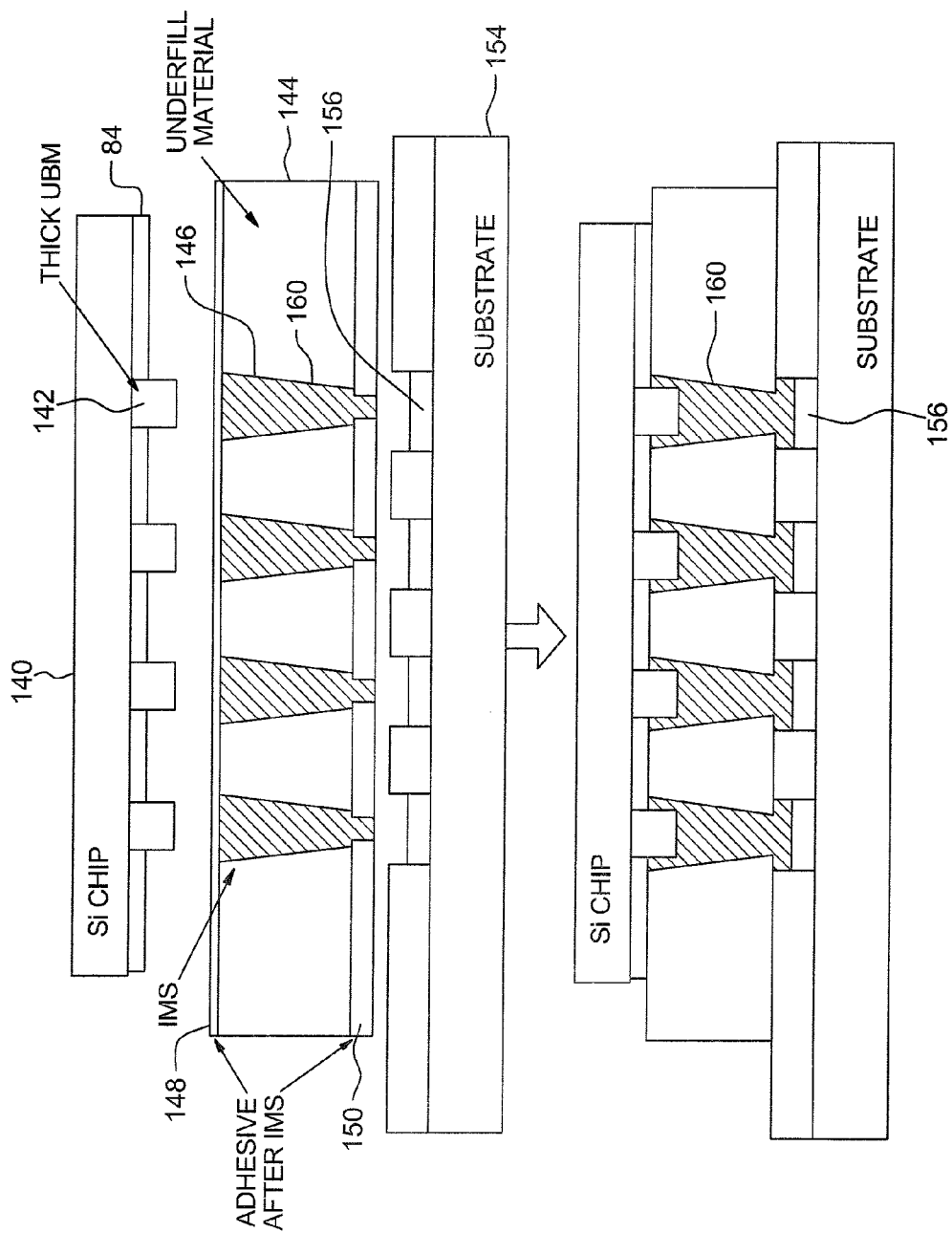
FIGS. 5A and 5B illustrates alternative UBM and two layer bonding steps.

In the modification as shown in FIG. 5A of the drawings, there is provided a silicon chip 140 containing thick UBMs 142 facing towards the upper surface of a decal 144 and having solder filled holes 146 in the resultant underfill material. Adhesives 148, 150 are applied to both sides onto the surfaces of the underfill material 144, the upper adhesive layer 148 being somewhat thinner than the lower adhesive layer 150, and which are both applied subsequent to the IMS process. Thereafter, a substrate 154 having a thick pads 156, and silicon chip 140 are pressed together towards, respectively, the lower and upper surfaces of the underfill material decal 144, with the adhesive layers being interposed therebetween, and the UBMs 142 entering into contact with the, respective, upper ends of solder 160 in the holes 146, and the substrate pads 156 being in contact with the lower ends of the solder 160 projecting from the holes in the underfill material decal 144.

Figure 5B:
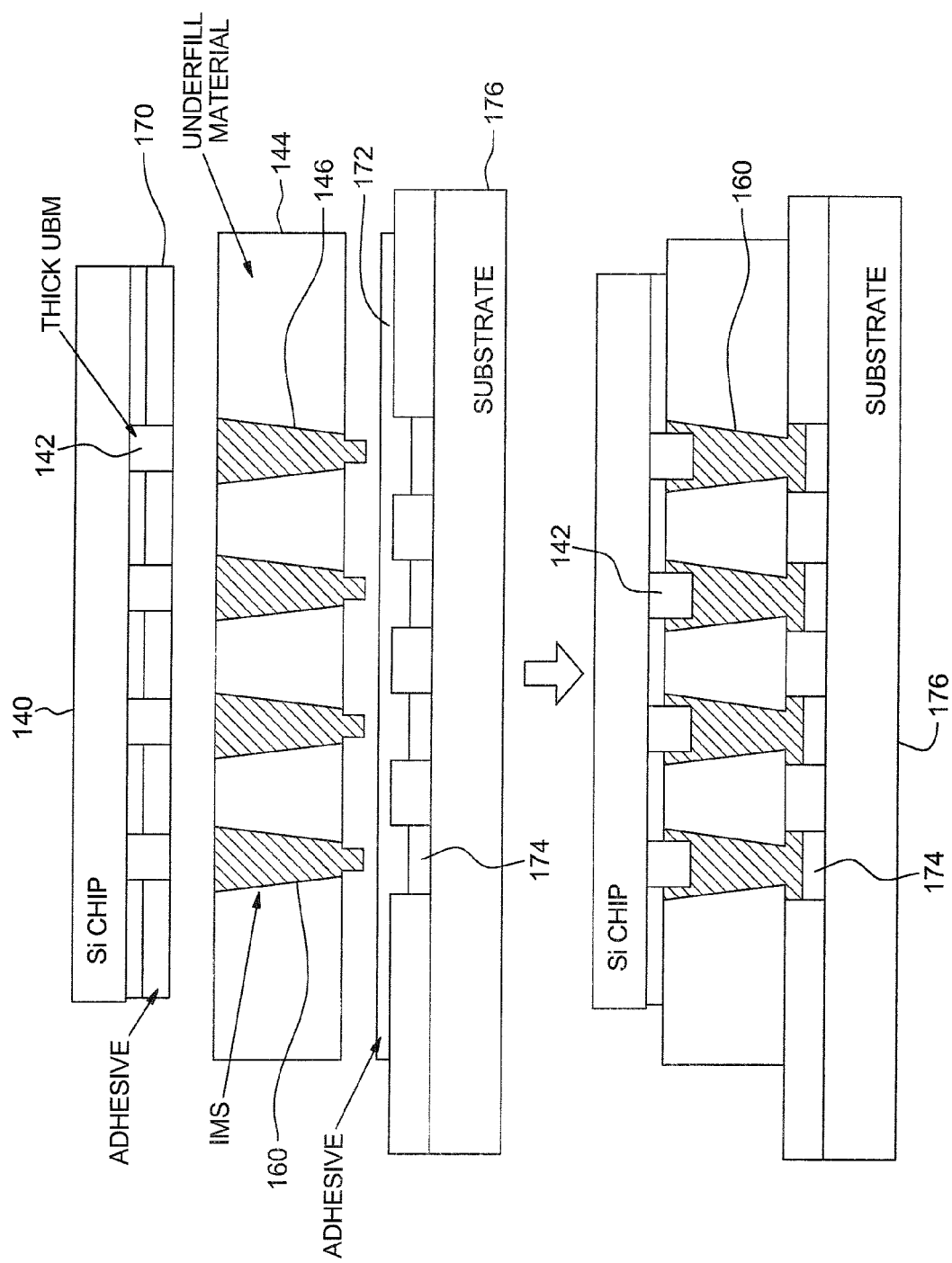

Similarly, in FIG. 5B of the drawings, showing thick UBMs 142 and a layer of film material 144, a thin adhesive layer 170 encompasses the thick UBMs 142 depending from a silicon chip 140, facing the solder filled holes 146 in the underfill material forming the decal 144. A further thin adhesive layer 172 projecting from thick conductive pads 174 on a substrate 176 on the opposite of the decal 144, enables these components then to be compressed, such that the UBMs 142 enter into the solder 160 at the upper end of the holes in the underfill material decal 144 whereas the projecting lower ends of the solder 160 come into contact with the pads 174 on the substrate 176.

Figure 6A:
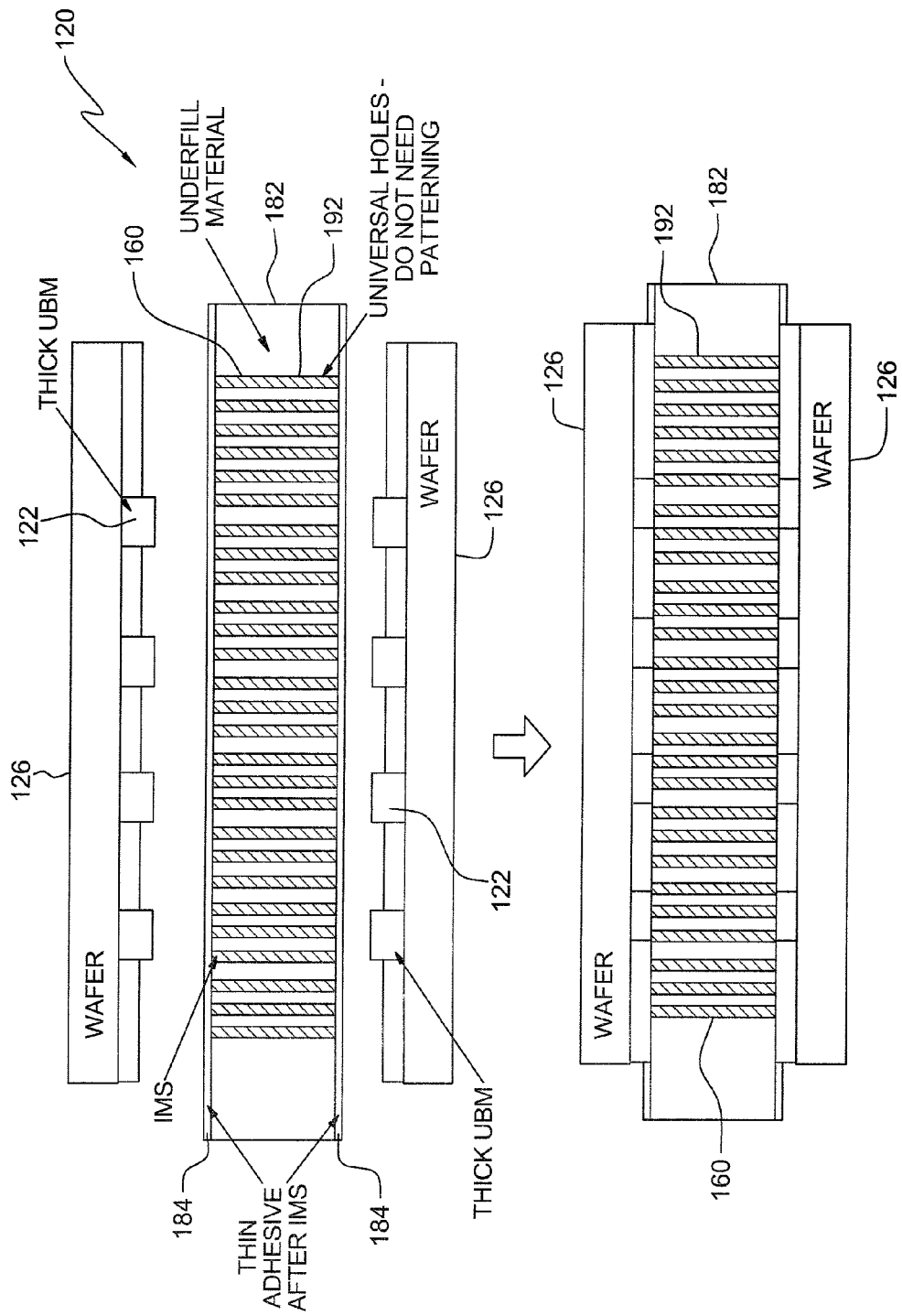
FIGS. 6A and 6B illustrates alternative wafer-to-wafer and thick UBM bonding method steps.

In FIG. 6A, similar to FIG. 4A, employing similar reference numerals for similar components, there is illustrated a wafer-to-wafer bonding structure 120 with thick UBMs 180 on an upper wafer 126 underfill decal of a single film layer 182, with a thin adhesive 184 being applied to opposite surfaces thereof subsequent to an IMS process.

Furthermore, a lower wafer 126 having upwardly extending UBMs 122 is adapted to contact the universal holes 192 in the decal 182, which are filled with the solder 160 during the IMS process, in order to produce interconnects between a chip and a substrate (not shown). These universal holes in the decal 182 forming the underfill material enable an electron flow in a direction which is not perpendicular but along the longitudinal direction of the structure, and enables the method to be applied to ultra-fine pitch products, saving process time since there is no requirement for any alignment to be present among the semiconductor chip, decal layer and the substrate components.

Figure 6B:
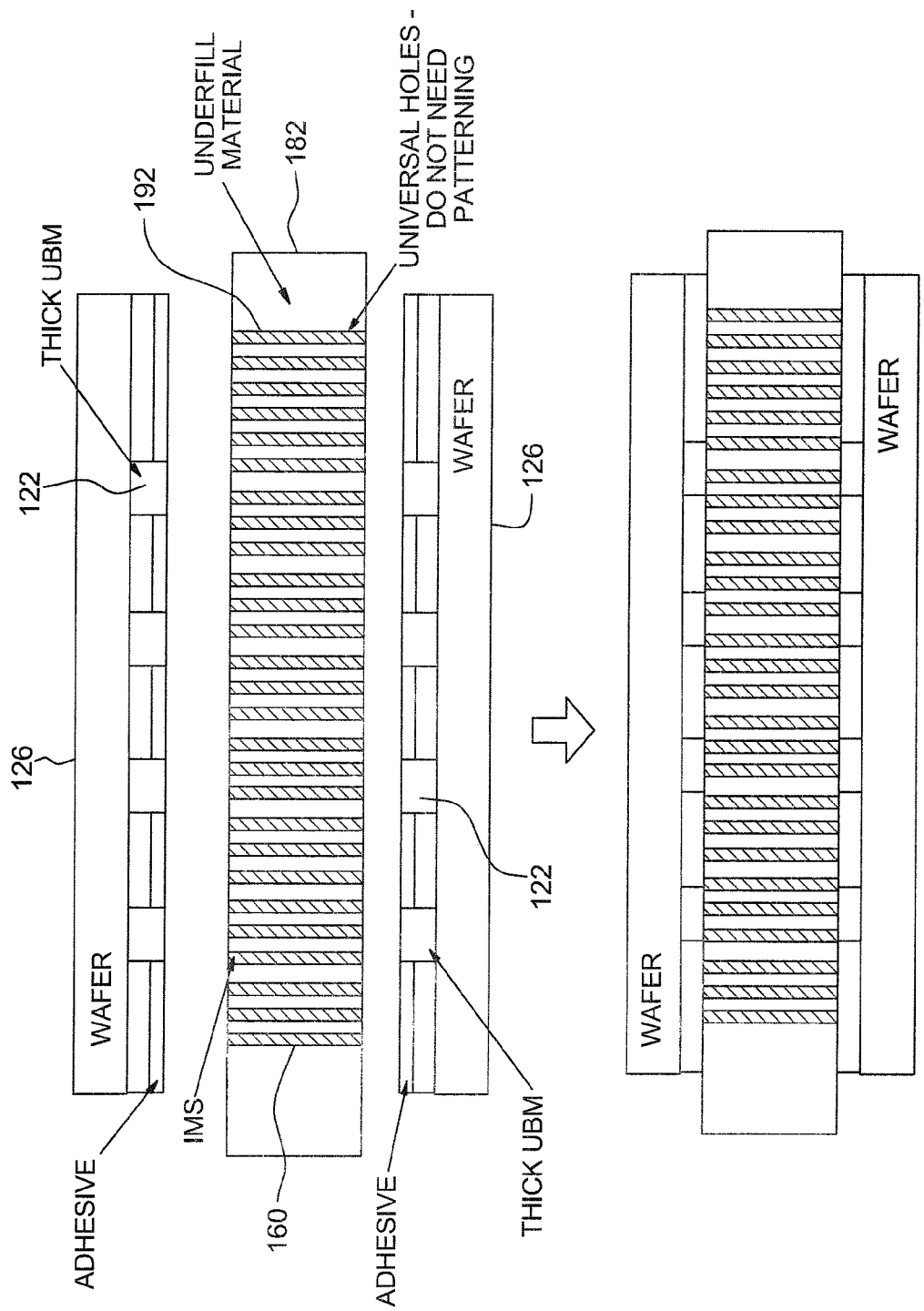

Finally, similar to FIG. 6A, as illustrated in FIG. 6B of the drawing wafer-to-wafer bonding with thick UBM and one layer film is also applicable herein, wherein the upper and lower structural components are essentially identical in opposite directions and contain thick UBMs and adhesive material, a thin layer thereof encompassing the UBMs facing towards the underfill material decal containing the universal holes which are filled with the solder by the IMS process. As the wafers are pressed towards the opposing surfaces of the underfill material decal, the adhesive layers are contacting therebetween, and the UBMs on both sides contact the ends of each of the solder materials contained in the various universal holes formed in the underfill material decal.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. A method of producing wafer level interconnect decals, said method comprising the steps of:
  (a) providing a plurality of superimposed apertured decals, said plurality of decals including an upper layer having tapered feature holes, a center layer having through features holes in alignment with said tapered feature holes in alignment with the through feature holes in a bottom layer located on an opposite side of said center layer;

(b) forming vacuum holes in said center layer in alignment with vacuum holes in said bottom layer arranged about the peripheries of said layers for maintaining said layers in aligned relationship;

(c) positioning a carrier beneath said bottom layer, said carrier having vacuum holes located in alignment with the vacuum holes in said bottom and center layers;

(d) imparting a vacuum to said vacuum holes to maintain said carrier and decal layers in a clamped position;

(e) filling the feature holes in said decal layers with molten solder and cooling said solder;

(f) peeling said upper layer from said center layer and applying an adhesive layer to the exposed surface of said center layer encompassing projecting solder portions; and (g) mounting a wafer on said exposed surface in contact with said adhesive and solder portions.

2. A method as claimed in claim 1, wherein said carrier is removed from said bottom layer so as to facilitate said bottom layer to be peeled from said center layer and exposing solder portions projecting on that side from said center layer.

3. A method as claimed in claim 2, wherein an adhesive is applied to exposed lower surface of said center layer, and a substrate is mounted in contact with said adhesive and the exposed solder portions.

4. A method as claimed in claim 3, wherein electrically conductive pads are interposed between electronic components on said substrate and on said wafer and the projecting solder portions on opposite sides of said center layer.

5. A method as claimed in claim 4, wherein said wafer is subsequently diced into individual semiconductor chip segments.

6. A method as claimed in claim 2, wherein said wafer includes recesses facing said center layer, under bump materials (UBM) being positioned on said adhesive and projecting solder portions in contact with said adhesive.

7. A method as claimed in claim 1, wherein said center layer comprises an underfill material.

8. A method as claimed in claim 1, wherein said upper, center and bottom decal layers are in the form of film webs.

9. A method as claimed in claim 8, wherein said film webs are constituted of polyimides selected to withstand a subsequent injection molding solder (IMS) process conducted a melting temperature for the solder.

10. A method as claimed in claim 9, wherein said center layer comprises a filler-containing polymer for enhancing the coefficient of thermal expansion (CTE) of said center layer as an underfill material.

11. A method as claimed in claim 1, wherein the tapered feature holes formed in said upper and bottom layers have larger ends thereof adjacent said center layer so as to facilitate the peeling away of said upper and bottom layers from said center layer.

12. A method as claimed in claim 1, wherein subsequent to said upper and bottom layers being peeled from said center layer, and adhesive is applied to, respectively, the upper and lower surface of said center layer so as to encompass the exposed solder portions, and wafers are applied to both sides of said center layer in contact with the adhesives and the exposed solder portions.

13. A method as claimed in claim 12, wherein said through feature holes extending through said center layer are conically tapered and at opposite ends, respectively, have the solder contained therein, contacted by under bump material (UBM) located on silicon semiconductor chips and electrically conductive pads on a substrate.

14. A wafer level interconnect decal arrangement, comprising:

(a) a plurality of superimposed apertured decals, said plurality of decals including an upper layer having tapered feature holes, a center layer having through features holes in alignment with said tapered feature holes in alignment with the through feature holes in a bottom layer located on an opposite side of said center layer;

(b) vacuum holes in said center layer being in alignment with vacuum holes in said bottom layer arranged about the peripheries of said layers for maintaining said layers in aligned relationship;

(c) a carrier being positioned beneath said bottom layer, said carrier having vacuum holes located in alignment with the vacuum holes in said bottom and center layers; whereby a vacuum is imparted to said vacuum holes to maintain said carrier and decal layers in a clamped position;

(d) the feature holes in said decal layers being filled with molten solder and cooled;

(e) said upper layer being peeled from said center layer, and an adhesive layer applied to the exposed surface of said center layer encompassing projecting solder portions; and (f) a wafer being mounted on said exposed surface in contact with said adhesive and solder portions.

15. An arrangement as claimed in claim 14, wherein said carrier is removed from said bottom layer so as to facilitate said bottom layer to be peeled from said center layer and exposing solder portions projecting on that side from said center layer.

16. An arrangement as claimed in claim 15, wherein an adhesive is applied to exposed lower surface of said center layer, and a substrate is mounted in contact with said adhesive and the exposed solder portions.

17. An arrangement as claimed in claim 16, wherein electrically conductive pads are interposed between electronic components on said substrate and on said wafer and the projecting solder portions on opposite sides of said center layer.

18. An arrangement as claimed in claim 17, wherein said wafer is diced to form individual semiconductor chip segments.

19. An arrangement as claimed in claim 15, wherein said wafer includes recesses facing said center layer, under bump materials (UBM) being positioned on said adhesive and projecting solder portions in contact with said adhesive.

20. An arrangement as claimed in claim 14, wherein said center layer comprises an underfill material.

21. An arrangement as claimed in claim 14, wherein said upper, center and bottom decal layers are in the form of film webs constituted of polyimides selected to withstand a subsequent injection molding solder (IMS) process conducted a melting temperature for the solder.

22. An arrangement as claimed in claim 21, wherein said center layer comprises a filler-containing polymer for enhancing the coefficient of thermal expansion (CTE) of said center layer as an underfill material.

23. An arrangement as claimed in claim 14, wherein the tapered feature holes formed in said upper and bottom layers have larger ends thereof adjacent said center layer so as to facilitate the peeling away of said upper and bottom layers from said center layer.

24. An arrangement as claimed in claim 14, wherein subsequent to said upper and bottom layers being peeled from said center layer, and adhesive is applied to, respectively, the upper and lower surface of said center layer so as to encompass the exposed solder portions, and wafers are applied to both sides of said center layer in contact with the adhesives and the exposed solder portions.

25. An arrangement as claimed in claim 24, wherein said through feature holes extending through said center layer are conically tapered and at opposite ends, respectively, have the solder contained therein, contacted by under bump material (UBM) located on silicon semiconductor chips and electrically conductive pads on a substrate.

* * * * *